US012648188B2

(12) United States Patent
Kim et al.

(10) Patent No.: US 12,648,188 B2
(45) Date of Patent: Jun. 2, 2026

(54) POWER SEMICONDUCTOR DEVICE INCLUDING A SHIELDING REGION

(71) Applicant: SAMSUNG ELECTRONICS CO., LTD., Suwon-si (KR)

(72) Inventors: Kwangsoo Kim, Seoul (KR); Jinhee Cheon, Seoul (KR)

(73) Assignees: SAMSUNG ELECTRONICS CO., LTD., Suwon-si (KR); SOGANG UNIVERSITY RESEARCH FOUNDATION, Seoul (KR)

( * ) Notice: Subject to any disclaimer, the term of this patent is extended or adjusted under 35 U.S.C. 154(b) by 759 days.

(21) Appl. No.: 17/950,507

(22) Filed: Sep. 22, 2022

(65) Prior Publication Data

US 2023/0231009 A1　　Jul. 20, 2023

(30) Foreign Application Priority Data

Jan. 17, 2022　(KR) ......................... 10-2022-0006676

(51) Int. Cl.
　　*H10D 62/10*　　(2025.01)
　　*H10D 12/01*　　(2025.01)
　　　　(Continued)

(52) U.S. Cl.
　　CPC ......... *H10D 62/111* (2025.01); *H10D 12/031* (2025.01); *H10D 30/668* (2025.01); *H10D 62/393* (2025.01); *H10D 62/8325* (2025.01)

(58) Field of Classification Search
　　CPC ............... H10D 62/111; H10D 62/393; H10D 62/8325; H10D 12/031; H10D 30/668
　　See application file for complete search history.

(56) References Cited

U.S. PATENT DOCUMENTS 7,642,597 B2　　1/2010　Saito
9,461,127 B2　　10/2016　Zeng et al.
　　　　(Continued)

FOREIGN PATENT DOCUMENTS

KR　　10-2017-0122335 A　　11/2017
KR　　　10-1964153 B1　　4/2019

OTHER PUBLICATIONS

Nakamura, et al., "High Performance SiC Trench Devices with Ultra-low Ron", 2011, International Electron Devices Meeting, 4 pages total.

(Continued)

*Primary Examiner* — Eric W Jones
*Assistant Examiner* — Sammantha K Salaz
(74) *Attorney, Agent, or Firm* — Sughrue Mion, PLLC

(57) ABSTRACT

A power semiconductor device includes a base semiconductor layer including impurities of a first conductivity type; a body portion provided on the base semiconductor layer and defined by a source trench, the body portion including a gate trench extending inwardly from an upper surface of the body portion; a gate electrode provided in the gate trench; a source electrode provided on the body portion and spaced apart from the gate electrode; and a drain electrode provided below the base semiconductor layer, wherein the body portion includes: a drift layer provided on the base semiconductor layer and including impurities of the first conductivity type; and a pair of shielding regions provided in the drift layer, spaced apart from each other in a horizontal direction, and spaced apart from the base semiconductor layer and the gate trench, the pair of shielding regions including impurities of a second conductivity type different from the first conductivity type.

19 Claims, 15 Drawing Sheets

1

(51) Int. Cl.
　　　H10D 30/66　　　(2025.01)
　　　H10D 62/17　　　(2025.01)
　　　H10D 62/832　　(2025.01)

(56)　　　　　　　References Cited

U.S. PATENT DOCUMENTS

| | | | |
|---|---|---|---|
| 9,466,709 | B2 | 10/2016 | Konstantinov |
| 9,761,702 | B2 | 9/2017 | Zeng et al. |
| 2008/0150020 | A1 | 6/2008 | Challa et al. |
| 2013/0153999 | A1 | 6/2013 | Zhang et al. |
| 2014/0353747 | A1* | 12/2014 | Cheng ................. H10D 64/516 257/334 |
| 2019/0259841 | A1* | 8/2019 | Stegner ............... H10D 30/668 |
| 2021/0184009 | A1 | 6/2021 | Wang |

OTHER PUBLICATIONS

Kim, et al., "High Breakdown Voltage and Low On-Resistance 4H—SiC UMOSFET with Source-Trench Optimization", 2019, ECS Journal of Solid State Science and Technology, vol. 8, Issue 8, 6 pages total.

* cited by examiner

POWER SEMICONDUCTOR DEVICE INCLUDING A SHIELDING REGION

CROSS-REFERENCE TO RELATED APPLICATION

This application is based on and claims priority under 35 U.S.C. § 119 to Korean Patent Application No. 10-2022-0006676, filed on Jan. 17, 2022, in the Korean Intellectual Property Office, the disclosure of which is incorporated by reference herein in its entirety.

BACKGROUND

The present disclosure relates to a power semiconductor device, and more particularly, to a metal oxide semiconductor field effect transistor (MOSFET) power semiconductor device.

A power semiconductor device is a semiconductor device that operates in a high voltage and high current environment, and is used in fields requiring high power switching, such as power conversion, a power converter, an inverter, etc.

A power semiconductor device is required to withstand high voltage, and recently, a high speed switching operation is additionally required.

SUMMARY

Example embodiments provide a power semiconductor device with improved static and dynamic characteristics.

According to an aspect of an embodiment, a power semiconductor device includes: a base semiconductor layer including impurities of a first conductivity type; a body portion provided on the base semiconductor layer and defined by a source trench, the body portion including a gate trench extending inwardly from an upper surface of the body portion; a gate electrode provided in the gate trench; a source electrode provided on the body portion and spaced apart from the gate electrode; and a drain electrode provided below the base semiconductor layer, wherein the body portion includes: a drift layer provided on the base semiconductor layer and including impurities of the first conductivity type; and a pair of shielding regions provided in the drift layer, spaced apart from each other in a horizontal direction, and spaced apart from the base semiconductor layer and the gate trench, the pair of shielding regions including impurities of a second conductivity type different from the first conductivity type.

According to an aspect of an embodiment, a power semiconductor device includes: a base semiconductor layer including impurities of a first conductivity type; a body portion provided on the base semiconductor layer and defined by a source trench, the body portion including a gate trench extending inwardly from an upper surface of the body portion; a gate electrode provided in the gate trench; a source electrode provided on the body portion and spaced apart from the gate electrode; and a drain electrode provided below the base semiconductor layer, wherein the body portion includes: a drift layer including impurities of the first conductivity type, a lower drift layer provided on the base semiconductor layer, and an upper drift layer provided on the lower drift layer; a pillar region covering the drift layer along a bottom surface and inner side surfaces of the source trench, the pillar region including impurities of a second conductivity type different from the first conductivity type; and at least one shielding region provided between the lower drift layer and the upper drift layer, the at least one shielding region including impurities of the second conductivity type.

According to an aspect of the disclosure, a power semiconductor device includes: a base semiconductor layer including impurities of a first conductivity type; a body portion provided on the base semiconductor layer and defined by a source trench, the body portion including 4H—SiC and a gate trench extending inwardly from an upper surface of the body portion; a gate electrode provided in the gate trench; a source electrode spaced apart from the gate electrode and provided on the body portion; and a drain electrode provided below the base semiconductor layer, wherein the body portion includes: a drift layer including impurities of the first conductivity type, a lower drift layer provided on the base semiconductor layer, and an upper drift layer provided on the lower drift layer; a pair of shielding regions provided between the lower drift layer and the upper drift layer, spaced apart from each other in a horizontal direction, and spaced apart from the base semiconductor layer and the gate trench, the pair of shielding regions including impurities of a second conductivity type different from the first conductivity type; a pillar region covering the lower drift layer, the pair of shielding regions, and the upper drift layer along a bottom surface and inner side surfaces of the source trench, the pillar region including impurities of the second conductivity type; a base region provided on the drift layer and doped with impurities of the second conductivity type at a concentration lower than a concentration of the impurities of the second conductivity type of the pair of shielding regions; a source region provided on the base region, connected to the source electrode, and doped with impurities of the first conductivity type at a concentration higher than a concentration of the impurities of the first conductivity type of the drift layer; and a pair of ohmic regions disposed at ends of the base region and the source region to be in contact with an upper end of the pillar region, the pair of ohmic regions being doped with impurities of the second conductivity type at a concentration higher than the concentration of the impurities of the second conductivity type of the base region.

BRIEF DESCRIPTION OF THE DRAWINGS

The above and other aspects, features, and advantages of certain example embodiments of the disclosure will be more apparent from the following detailed description taken in conjunction with the accompanying drawings, in which.

DETAILED DESCRIPTION

Figure 1:
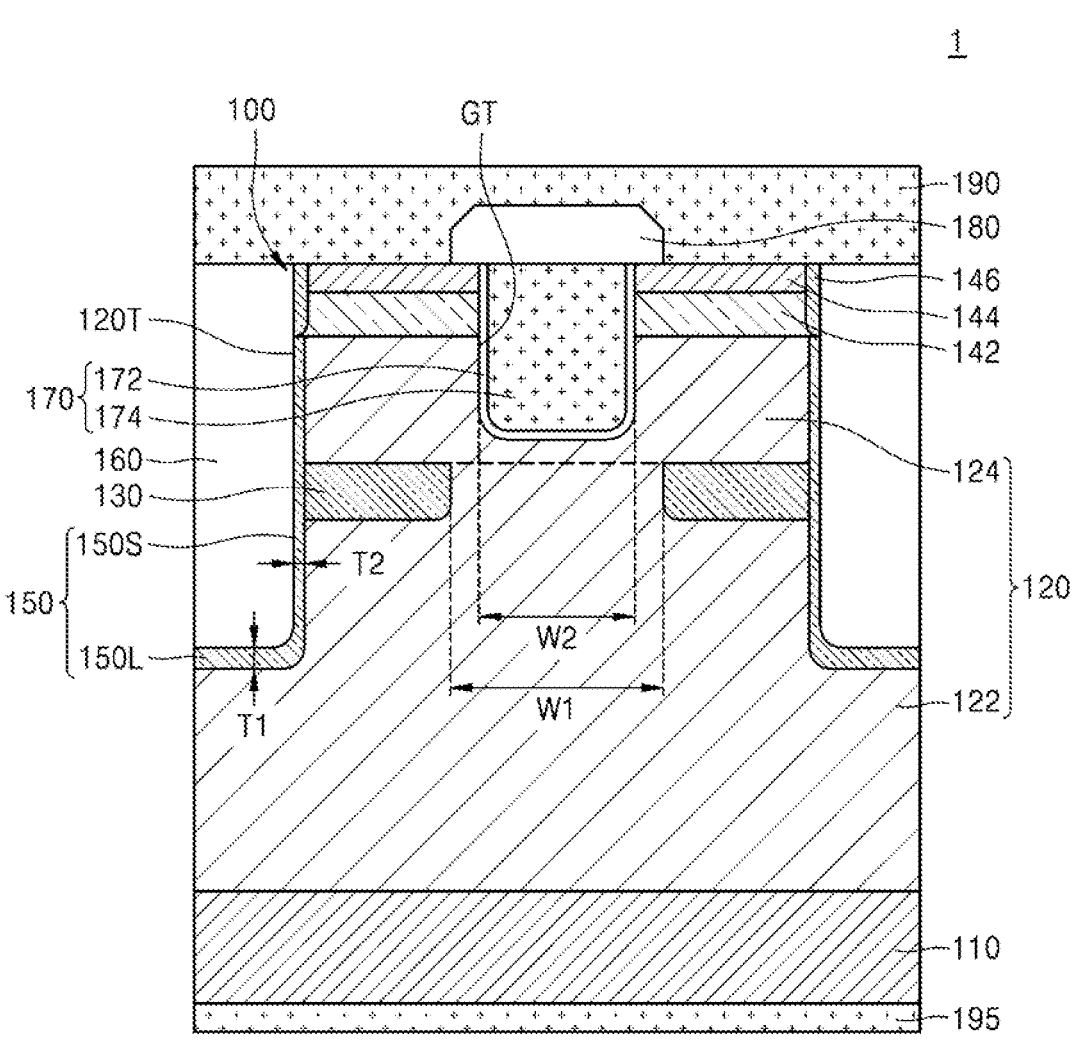
FIG. 1 is a cross-sectional view showing a power semiconductor device according to an embodiment.

FIG. 1 is a cross-sectional view showing a power semiconductor device 1 according to embodiments.

Referring to FIG. 1, the power semiconductor device 1 includes a base semiconductor layer 110, a body portion 100, and a gate structure 170. In some embodiments, the body portion 100 includes a drift layer 120, a pair of shielding regions 130, a base region 142, a source region 144, a pair of ohmic regions 146, and a pillar region 150. For example, the power semiconductor device 1 may be a metal oxide semiconductor field effect transistor (MOSFET) power semiconductor device.

The base semiconductor layer 110 may include a semiconductor material, such as Si or Ge, or a compound semiconductor material, such as SiGe, SiC, GaAs, InAs, or InP. For example, the base semiconductor layer 110 may include at least one of a group III-V material and a group IV material. The group III-V material may be a binary, ternary, or quaternary compound including at least one group III element and at least one group V element. The base semiconductor layer 110 may include 4H—SiC, but is not limited thereto.

The base semiconductor layer 110 may include impurities of a first conductivity type. For example, the first conductivity type may be n-type. The impurities of the first conductivity type may be, for example, n-type impurities, such as phosphorus (P), arsenic (As), antimony (Sb), etc. In some embodiments, the base semiconductor layer 110 may be doped with impurities of the first conductivity type at a high concentration. For example, the base semiconductor layer 110 may be doped with impurities of the first conductivity type at a concentration of about $5\times10^{18}/cm^3$ to about $5\times10^{19}/cm^3$. The base semiconductor layer 110 may have a thickness of about 1 μm to about 5 μm.

In some embodiments, the base semiconductor layer 110 may be a part of a semiconductor wafer. For example, the base semiconductor layer 110 may be an upper part of the semiconductor wafer remaining by removing a lower part thereof. In some embodiments, the base semiconductor layer 110 may be an epitaxial layer formed on a support substrate. When the base semiconductor layer 110 is the epitaxial layer, the support substrate may be removed in a subsequent process. The support substrate may be, for example, a semiconductor wafer.

The drift layer 120 may be disposed on the base semiconductor layer 110. The drift layer 120 may include a semiconductor material or a compound semiconductor material. For example, the drift layer 120 may be an epitaxial layer formed on the base semiconductor layer 110.

In some embodiments, the drift layer 120 may include silicon carbide (SiC). SiC has various polymorphic crystal forms. For example, SiC is classified and called 3C—SiC, 4H—SiC, 6H—SiC, 15R—SiC, etc. according to polymorphic crystal forms, which are caused by different stacking cycles in a specific crystal direction (for example, from a hexagonal system to a 0001 direction). The leading number of the various names indicates the stacking cycles. For example, in the case of 3C—SiC, three layers are one unit and repeat periodically. In the case of 4H—SiC, four layers are one unit and repeat periodically, and in the case of 6H—SiC, six layers are one unit and repeat periodically. For example, the C in 3C means cubic, the H in 4H means hexagonal, and the R in 15R means rhombohedral. In some embodiments, the drift layer 120 may include 4H—SiC.

The drift layer 120 may include impurities of the first conductivity type. In some embodiments, the drift layer 120 may be doped with impurities of the first conductivity type at a lower concentration than that of the base semiconductor layer 110. For example, the drift layer 120 may be doped with impurities of the first conductivity type at a concentration of about $5\times10^{15}/cm^3$ to about $5\times10^{16}/cm^3$. The drift layer 120 may have a thickness of about 10 μm to about 20

μm. In some embodiments, the sum of thicknesses of the base semiconductor layer 110 and the drift layer 120 may be about 11 μm to about 25 μm.

The drift layer 120 may have a stacked structure of a lower drift layer 122 and an upper drift layer 124. For example, the lower drift layer 122 may be disposed on the base semiconductor layer 110, and the upper drift layer 124 may be disposed on the lower drift layer 122. The lower drift layer 122 may be between the base semiconductor layer 110 and the upper drift layer 124. The lower drift layer 122 may be an epitaxial layer formed on the base semiconductor layer 110. The upper drift layer 124 may be an epitaxial layer formed on the lower drift layer 122.

The drift layer 120 may include a lower part and an upper part such that the upper part has a horizontal width narrower than that of the lower part. The upper part of the drift layer 120 may be located at the same vertical level as a pair of source trenches 120T extending from the uppermost surface of the drift layer 120 toward the base semiconductor layer 110, and the lower part of the drift layer 120 may be located at a vertical level lower than that of bottom surfaces of the pair of source trenches 120T.

The pair of source trenches 120T may have the upper part of the drift layer 120 therebetween, and may be apart from each other in a horizontal direction. The pair of source trenches 120T may define the body portion 100. The body portion 100 may include SiC. In some embodiments, the body portion 100 may include 4H—SiC.

The source trench 120T may extend from an upper surface of the source region 144 toward the base semiconductor layer 110, but may not extend all the way to an upper surface of the base semiconductor layer 110. For example, a depth of the source trench 120T may be about 6 μm to about 12 μm.

In some embodiments, a vertical level of the bottom surface of the source trench 120T may be lower than a vertical level of the uppermost surface of the lower drift layer 122. That is, the source trench 120T may extend from an upper surface of the body portion 100 into the lower drift layer 122. The lower part of the drift layer 120 may be defined as including a lower part of the lower drift layer 122, and the upper part of the drift layer 120 may be defined as including both the upper part of the lower drift layer 122 and the upper drift layer 124.

Each of the lower drift layer 122 and the upper drift layer 124 may include impurities of the first conductivity type. Each of the lower drift layer 122 and the upper drift layer 124 may be doped with impurities of the first conductivity type at the same or substantially similar concentration. In some embodiments, a thickness of the lower drift layer 122 may be greater than a thickness of the upper drift layer 124. For example, the thickness of the lower drift layer 122 may be about 8 μm to about 15 μm, and the thickness of the upper drift layer 124 may be about 2 μm to about 6 μm.

The shielding region 130 may be located in the drift layer 120. The shielding region 130 may be apart from the base semiconductor layer 110. The shielding region 130 may be between the lower drift layer 122 and the upper drift layer 124. A lower surface of the shielding region 130 may be at a higher vertical level than that of the lower surface of the source trench 120T. That is, the source trench 120T may extend from the upper surface of the body portion 100 to be lower than the shielding area 130.

The shielding region 130 may include impurities of a second conductivity type. For example, the second conductivity type may be a p-type. The impurities of a second conductivity type may be, for example, a p-type impurity, such as aluminum (Al), boron (B), indium (In), potassium (K), etc. In some embodiments, the shielding region 130 may be doped with impurities of the second conductivity type at a high concentration. For example, the shielding region 130 may be doped with impurities of the second conductivity type at a concentration of about $1 \times 10^{18}/cm^3$ to about $5 \times 10^{18}/cm^3$. The shielding region 130 may have a thickness of about 0.5 µm to about 2 µm.

In some embodiments, the body portion 100 may include a pair of shielding regions 130 apart from each other in a horizontal direction. The pair of shielding regions 130 may be disposed in both ends between the lower drift layer 122 and the upper drift layer 124 in the horizontal direction between the lower drift layer 122 and the upper drift layer 124. In other words, each shielding region 130 of the pair of shielding regions may be disposed at a respective end of the drift layer 120 in the horizontal direction. The pair of shielding regions 130 may be apart from each other by a distance equal to a first width W1. In some embodiments, the first width W1 may be about 1.2 µm to about 2 µm.

In some embodiments, the pair of shielding regions 130 may be formed by doping a part of an upper side of the lower drift layer 122 with impurities of the second conductivity type. The pair of shielding regions 130 may include SiC. In some embodiments, the pair of shielding regions 130 may include 4H—SiC. For example, the upper surface of each of the pair of shielding regions 130 and the uppermost surface of the lower drift layer 122 may be located at the same vertical level to be coplanar with each other.

The base region 142 and the source region 144 may be sequentially disposed on the upper drift layer 124. The base region 142 may be disposed on the upper drift layer 124. The base region 142 may include impurities of the second conductivity type. In some embodiments, the base region 142 may be doped with impurities of the second conductivity type at a lower concentration than that of the shielding region 130. For example, the base region 142 may be doped with impurities of the second conductivity type at a concentration of about $1 \times 10^{16}/cm^3$ to about $5 \times 10^{17}/cm^3$. The base region 142 may have a thickness of about 0.3 µm to about 1 µm.

The source region 144 may be disposed on the base region 142. The source region 144 may include impurities of the first conductivity type. The source region 144 may be doped with impurities of the first conductivity type at a high concentration. In some embodiments, the source region 144 may be doped with impurities of the first conductivity type at a higher concentration than that of the drift layer 120. For example, the source region 144 may be doped with impurities of the first conductivity type at a concentration of about $5 \times 10^{18}/cm^3$ to about $5 \times 10^{19}/cm^3$. The source region 144 may have a smaller thickness than that of the base region 142. For example, the source region 144 may have a thickness of about 0.1 µm to about 0.5 µm.

In some embodiments, the base region 142 and the source region 144 may be formed by doping a part of an upper side of the upper drift layer 124 with impurities of the second conductivity type and impurities of the first conductivity type, respectively. Each of the base region 142 and the source region 144 may include SiC. In some embodiments, each of the base region 142 and the source region 144 may include 4H—SiC.

A pair of ohmic regions 146 may be disposed in both ends of the base region 142 and the source region 144 in the horizontal direction. In other words, each of the pair of ohmic regions 146 may be disposed at a respective end of two ends of the base region 142 and the source region 144 in the horizontal direction. A vertical level of a lower surface of the pair of ohmic regions 146 may be equal to or lower than a vertical level of an upper surface of the upper drift layer 124. The pair of ohmic regions 146 may include impurities of the second conductivity type. In some embodiments, the pair of ohmic regions 146 may be doped with impurities of the second conductivity type at a higher concentration than that of each of the shielding region 130 and the base region 142. For example, the ohmic region 146 may be doped with impurities of the second conductivity type at a concentration of about $5 \times 10^{18}/cm^3$ to about $5 \times 10^{19}/cm^3$. A horizontal width of the ohmic region 146, that is, the thickness of the ohmic region 146 covering side surfaces of the base region 142 and the source region 144, may be about 0.5 µm to about 1 µm. The vertical height of the ohmic region 146 may be equal to or greater than the sum of the thickness of the base region 142 and the thickness of the source region 144.

In some embodiments, the pair of ohmic regions 146 may be formed by doping impurities of the second conductivity type on both sides of the base region 142 and the source region 144. Each of the pair of ohmic regions 146 may include SiC. In some embodiments, each of the pair of ohmic regions 146 may include 4H—SiC.

The pillar region 150 may be disposed on the bottom surface and inner side surfaces of the source trench 120T. The pillar region 150 may cover the lower drift layer 122, the shielding region 130, and the upper drift layer 124 along the bottom and inner side surfaces of the source trench 120T. The pillar region 150 may conformally cover the lower drift layer 122, the shielding region 130, and the upper drift layer 124 along the bottom and inner side surfaces of the source trench 120T. For example, the pillar region 150 may have a thickness of about 0.3 µm to about 0.8 µm and may extend along the bottom and inner side surfaces of the source trench 120T.

The pillar region 150 may include impurities of the second conductivity type. In some embodiments, the pillar region 150 may be doped with impurities of the second conductivity type at a lower concentration than that of the shielding region 130 and the ohmic region 146. For example, the pillar region 150 may be doped with impurities of the second conductivity type at a concentration of about $1 \times 10^{16}/cm^3$ to about $5 \times 10^{17}/cm^3$. The pillar region 150 may have a thickness of about 0.3 µm to about 1 µm.

The pillar region 150 may include a bottom pillar region 150L (e.g., a bottom region of the pillar region) and a side pillar region 150S (e.g., a side region of the pillar region). In the pillar region 150, the bottom pillar region 150L extends in the horizontal direction while covering the lower drift layer 122 along the bottom surface of the source trench 120T, and the side pillar region 150S extends in the vertical direction while covering the lower drift layer 122, the shielding region 130, and the upper drift layer 124 along the inner side surface of the source trench 120T. An upper end of the side pillar region 150S may contact the ohmic area 146, and a middle part of the side pillar region 150S in the vertical direction may contact the shielding region 130. In the drift layer 120 including impurities of the first conductivity type and the side pillar region 150S including impurities of the second conductivity type, pn junctions extend in the vertical direction and the p-type and n-type regions are completely depleted to form an electric field distribution in two dimensions, and thus a superjunction may be formed in which the electric field distribution in the vertical direction is uniformly formed.

In some embodiments, each of the bottom pillar region 150L and the side pillar region 150S may be separately formed by a separate process. In some embodiments, the first thickness T1 of the bottom pillar region 150L in the vertical direction may have a greater value than that of the second thickness T2 of the side pillar region 150S in the horizontal direction. For example, the first thickness T1 may be about 0.5 μm to about 0.8 μm, and the second thickness T2 may be about 0.3 μm to about 0.5 μm. In some embodiments, the second thickness T2 may have a value equal to or less than that of the horizontal width of the ohmic region 146, that is, the thickness of the ohmic region 146 covering side surfaces of the base region 142 and the source region 144.

The pillar region 150 may be exposed on the bottom and inner side surfaces of the source trench 120T. The bottom pillar region 150L may be exposed on the bottom surface of the source trench 120T, and the side pillar region 150S may be exposed on the inner side surface of the source trench 120T.

The pillar region 150 may be formed by doping the lower drift layer 122, the shielding region 130, and the upper drift layer 124 with impurities of the second conductivity type through the source trench 120T. The pillar region 150 may include SiC. In some embodiments, the pillar region 150 may include 4H—SiC.

For example, each of the pair of shielding regions 130 may extend from the pillar region 150, that is, the side pillar region 150S, into the drift layer 120, but may not contact each other. For example, one side of the lower drift layer 122, one side of any one of the pair of shielding regions 130, and one side of the upper drift layer 124 may be coplanar.

A filling insulating layer 160 covering the pillar region 150 may be filled in the source trench 120T. The filling insulating layer 160 may include oxide, nitride, oxynitride, or a combination thereof. In some embodiments, the filling insulating layer 160 may include silicon oxide.

Each of the pair of ohmic regions 146 may be between a side surface of the filling insulating layer 160 and side surfaces of both of the base region 142 and the source region 144.

The body portion 100 may include a gate trench GT extending from the uppermost surface of the body portion 100, i.e., the upper surface of the source region 144, into the drift layer 120 through the base region 142 and the source region 144. The gate trench GT extends into the upper drift layer 124, but may not extend to the upper surface of the lower drift layer 122. The gate trench GT may be apart from the shielding region 130. A bottom surface of the gate trench GT may be located at a higher vertical level than the upper surface of the pair of shielding regions 130. A depth of the gate trench GT may be greater than the sum of the thickness of the base region 142 and the thickness of the source region 144, and may be less than the sum of the thickness of the base region 142, the thickness of the source region 144, and the thickness of the upper drift layer 124. For example, the depth of the gate trench GT may be about 1.2 μm to about 1.8 μm. The gate trench GT may have a second width W2. In some embodiments, the second width W2 may have a value less than that of the first width W1. For example, the second width W2 may be about 1 μm to about 2.5 μm.

The gate trench GT may not overlap the pair of shielding regions 130 in the vertical direction. For example, the gate trench GT may overlap a part of the lower drift layer 122 between the pair of shielding regions 130 in the vertical direction.

The gate structure 170 may be filled in the gate trench GT. The gate structure 170 may include a gate insulating layer 172 and a gate electrode 174. The gate insulating layer 172 may conformally cover the bottom and inner side surfaces of the gate trench GT. For example, the gate insulating layer 172 may conformally cover surfaces of the base region 142, the source region 144, and the upper drift layer 124 in the gate trench GT.

The gate insulating layer 172 may include at least one selected from silicon oxide, silicon nitride, silicon oxynitride, oxide/nitride/oxide (ONO), or a high-k dielectric material having a dielectric constant higher than that of silicon oxide. The high-k material may have a dielectric constant of about 10 to about 25. For example, the high dielectric material may include at least one material selected from hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), or lead scandium tantalum oxide (PbScTaO). For example, the high-k material may include $HfO_2$, $Al_2O_3$, $HfAlO_3$, $Ta_2O_3$, or $TiO_2$. The gate insulating layer 172 may have a thickness of several tens of nm. For example, the gate insulating layer 172 may have a thickness of about 20 nm to about 70 nm.

The gate electrode 174 may be filled in the gate trench GT while covering the gate insulating layer 172. For example, the gate electrode 174 may include doped polysilicon, a metal material, such as W, Ti, or Ta, a conductive metal nitride, such as TiN, Ta, TaN, WN, TiSiN, WSiN, or a combination thereof.

A capping insulating layer 180 may cover the gate electrode 174. The capping insulating layer 180 may cover the entire upper surface of the gate electrode 174. In some embodiments, the capping insulating layer 180 may cover both the upper surface of the gate electrode 174 and the upper surface of the gate insulating layer 172. The capping insulating layer 180 may entirely overlap the gate trench GT in the vertical direction. For example, a horizontal width of the capping insulating layer 180 may be greater than the second width W2. In some embodiments, the capping insulating layer 180 may cover both the upper surface of the gate electrode 174 and the upper surface of the gate insulating layer 172, and may cover a part of the upper surface of the source region 144.

A source electrode 190 may be disposed on the source region 144. The source electrode 190 may contact each of the source region 144 and the pair of ohmic regions 146. In some embodiments, the source electrode 190 may cover the source region 144, the pair of ohmic regions 146, the filling insulating layer 160, and the capping insulating layer 180. The gate electrode 174 and the source electrode 190 may be apart from each other with the capping insulating layer 180 therebetween. For example, the source electrode 190 may include doped polysilicon, a metal material, a metal nitride, a metal silicide, or a combination thereof.

A drain electrode 195 may be disposed on a lower surface of the base semiconductor layer 110. The drain electrode 195 may completely cover the lower surface of the base semiconductor layer 110. For example, the drain electrode 195 may include doped polysilicon, a metal material, a metal nitride, a metal silicide, or a combination thereof.

The power semiconductor device 1 according to the disclosure may include the pillar region 150 disposed along the bottom and inner side surfaces of the source trench 120T, and the pair of shielding regions 130.

An interface between the drift layer 120 and the pillar region 150 may be formed in the vertical direction along the inner side surface of the source trench 120T, and the drift layer 120 including impurities of the first conductivity type and the pillar region 150 including impurities of the second conductivity type may form a superjunction. The superjunction formed by the drift layer 120 and the pillar region 150 may have a uniform electric field distribution in the vertical direction. Therefore, compared to the power semiconductor device of the related art, when the impurity concentration of the drift layer 120 is formed to be low, a breakdown voltage of the power semiconductor device 1 may be increased, and when the impurity concentration of the drift layer 120 is formed to be high, on-resistance may be decreased. The breakdown voltage and the on-resistance have a trade-off relationship according to the impurity concentration of the drift layer 120, and thus a figure of merit (FOM) ($BV^2/R_{on,sp}$) value obtained by dividing the square of the breakdown voltage of the power semiconductor device 1 by the on-resistance may be increased by optimizing the impurity concentration of the drift layer 120.

In the power semiconductor device 1 according to the example embodiment, because the superjunction formed by the drift layer 120 and the pillar region 150 is depleted of the p-type region and the n-type region, a high electric field may not be applied to the filling insulating layer 160, thereby improving the static characteristics of the power semiconductor device 1.

In the power semiconductor device 1 according to the example embodiment, the source trench 120T is a deep trench formed so that the bottom surface thereof is lower than a vertical level of the uppermost surface of the lower drift layer 122, and a depletion region may expand in an off region by the pillar region 150, and thus a parasitic capacitance between the gate electrode 174 and the drain electrode 195 may be reduced. In addition, because the power semiconductor device 1 according to the disclosure includes the shielding region 130 capable of suppressing a high electric field from being applied to the lower side of the gate insulating layer 172, the parasitic capacitance between the gate electrode 172 and the source electrode 190 is reduced, and thus an input capacitance may be reduced. Accordingly, a switching speed of the power semiconductor device 1 may be increased, energy loss may be reduced, and thus dynamic characteristics thereof may be improved.

FIGS. 2A to 2L are cross-sectional views illustrating a method of manufacturing the power semiconductor device 1, according to embodiments. Specifically, FIGS. 2A to 2L are cross-sectional views illustrating the method of manufacturing the power semiconductor device 1 shown in FIG. 1, and in FIGS. 2A to 2L, the same reference numerals as in FIG. 1 indicate substantially the same members, and redundant descriptions with those with reference to FIG. 1 may be omitted.

Figure 2A:
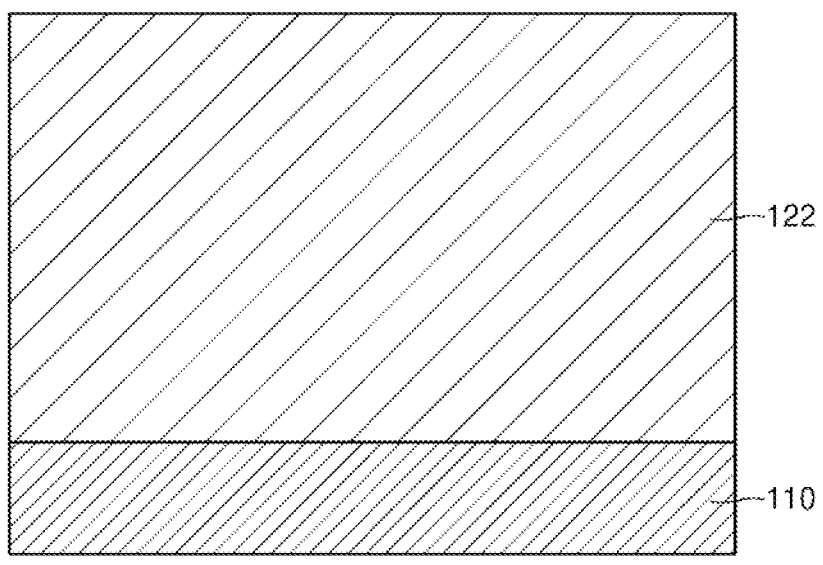
FIGS. 2A to 2L are cross-sectional views illustrating a method of manufacturing a power semiconductor device according to an embodiment.

Referring to FIG. 2A, the base semiconductor layer 110 is prepared, and then, the lower drift layer 122 is formed on the base semiconductor layer 110. In some embodiments, the base semiconductor layer 110 may be a part of a semiconductor wafer. For example, the base semiconductor layer 110 may show only an upper part of the semiconductor wafer, and a lower part of the semiconductor wafer may be removed before a subsequent process, for example, forming the drain electrode 195 shown in FIG. 1.

The lower drift layer 122 may be an epitaxial layer epitaxially grown using the base semiconductor layer 110 as a seed. Each of the base semiconductor layer 110 and the lower drift layer 122 may be formed to include 4H—SiC.

The base semiconductor layer 110 may be formed to include impurities of a first conductivity type. For example, the first conductivity type may be n-type. In some embodiments, the base semiconductor layer 110 may be formed to be doped with impurities of the first conductivity type at a high concentration. For example, the base semiconductor layer 110 may be doped with impurities of the first conductivity type at a concentration of about $5 \times 10^{18}/cm^3$ to about $5 \times 10^{19}/cm^3$.

The lower drift layer 122 may be formed to include impurities of the first conductivity type. In some embodiments, the lower drift layer 122 may be formed to be doped with impurities of the first conductivity type at a lower concentration than that of the base semiconductor layer 110. For example, the lower drift layer 122 may be doped with impurities of the first conductivity type at a concentration of about $5 \times 10^{11}/cm^3$ to about $5 \times 10^{16}/cm^3$. The lower drift layer 122 may be formed to have a thickness of about 8 μm to about 15 μm.

Figure 2B:
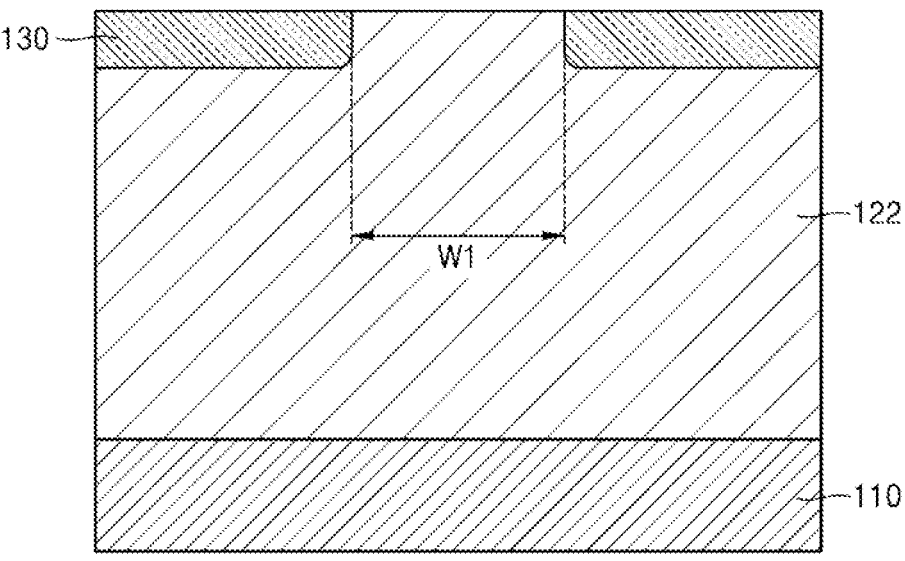

Referring to FIG. 2B, the pair of shielding regions 130 is formed in a part of an upper side of the lower drift layer 122. The pair of shielding regions 130 may be formed on the part of the upper side of the lower drift layer 122 to be apart from each other by the first width W1. In some embodiments, the first width W1 may be about 1.2 μm to about 2 μm.

The pair of shielding regions 130 may be formed by doping the part of the upper side of the lower drift layer 122 with impurities of a second conductivity type. For example, the shielding region 130 may be doped with impurities of the second conductivity type at a concentration of about $1 \times 10^{18}/cm^3$ to about $5 \times 10^8/cm^3$. The shielding region 130 may be formed to have a thickness of about 0.5 μm to about 2 μm. That is, the shielding region 130 may be formed to have a depth of about 0.5 μm to about 2 μm from the uppermost surface of the lower drift layer 122. For example, the upper surface of each of the pair of shielding regions 130 and the uppermost surface of the lower drift layer 122 may be located at the same vertical level to be coplanar.

Figure 2C:
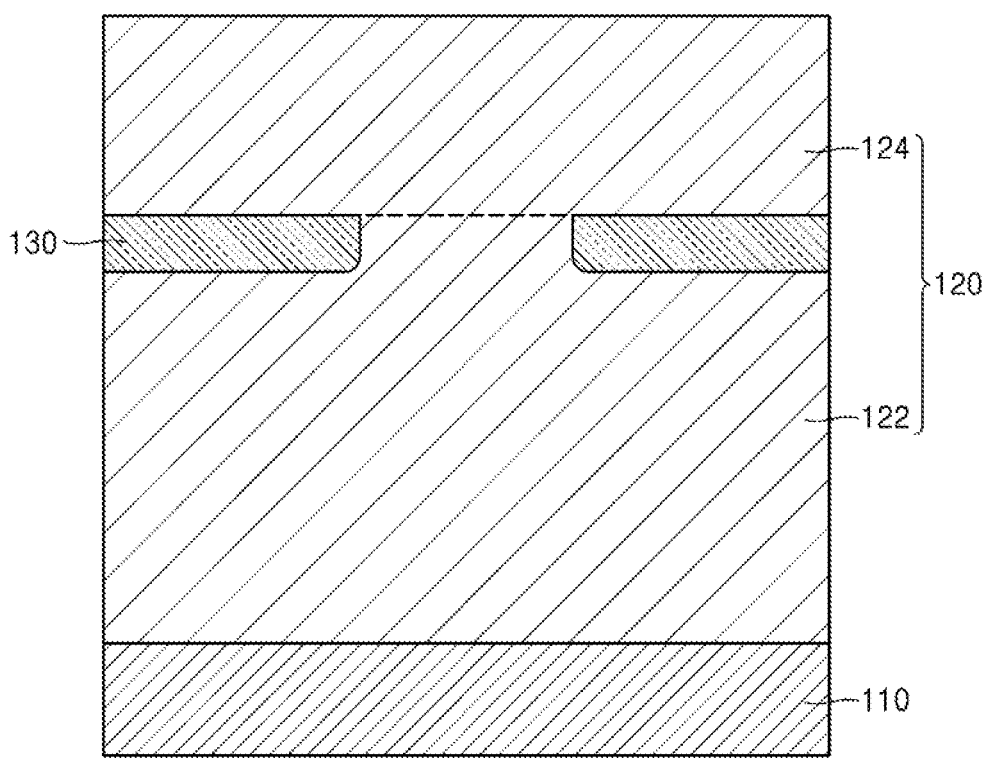

Referring to FIG. 2C, the upper drift layer 124 is formed on the pair of shielding regions 130 and the lower drift layer 122 to form the drift layer 120 including a stacked structure of the lower drift layer 122 and the upper drift layer 124. The drift layer 120 may be formed to have a thickness of about 10 μm to about 20 μm.

The upper drift layer 124 may be an epitaxial layer epitaxially grown using the lower drift layer 122 and the pair of shielding regions 130 as seeds. The upper drift layer 124 may be formed to include 4H—SiC.

The upper drift layer 124 may be formed to include impurities of the first conductivity type. In some embodiments, the upper drift layer 124 may be formed to be doped with impurities of the first conductivity type at the same or substantially similar concentration to that of the lower drift layer 122. For example, the upper drift layer 124 may be doped with impurities of the first conductivity type at a concentration of about $5 \times 10^{15}/cm^3$ to about $5 \times 10^{16}/cm^3$. The upper drift layer 124 may be formed to have a thickness that is less than that of the lower drift layer 122. The upper drift layer 124 may be formed to have a thickness of about 2 μm to about 6 μm.

Figure 2D:
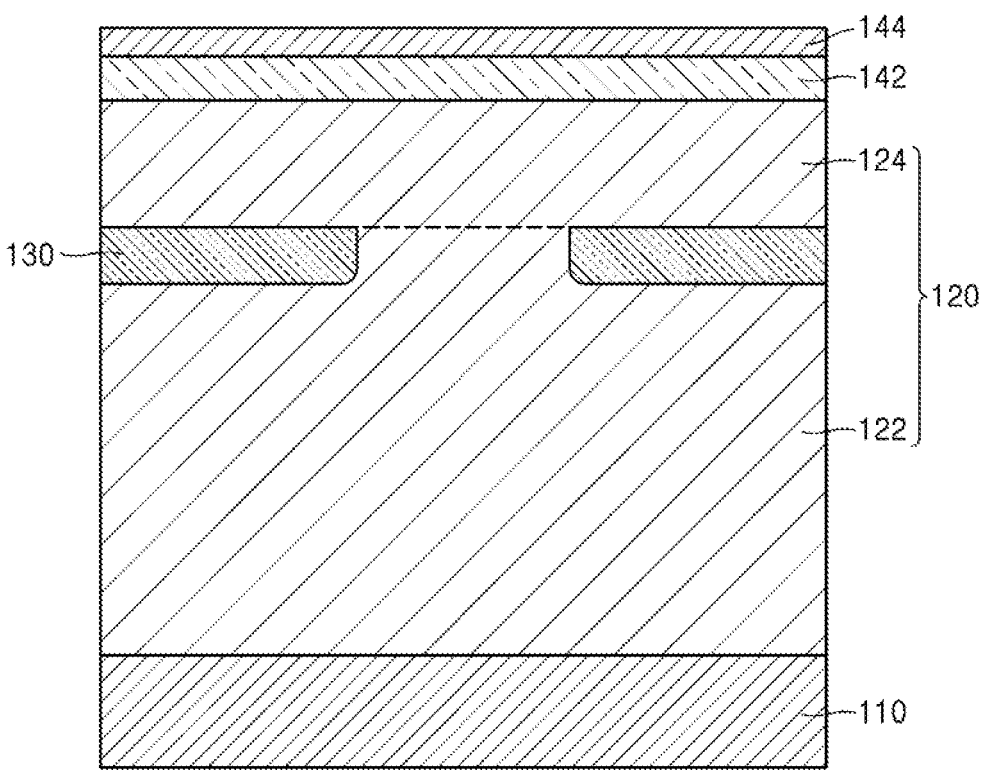

Referring to FIG. 2D, a base region 142 and a source region 144 are sequentially formed on the upper drift layer 124. Each of the base region 142 and the source region 144 may be formed to include 4H—SiC.

The base region 142 may be formed to include impurities of the second conductivity type. In some embodiments, the base region 142 may be doped with impurities of the second conductivity type at a lower concentration than that of the shielding region 130. For example, the base region 142 may be doped with impurities of the second conductivity type at a concentration of about $1\times10^{16}/cm^3$ to about $5\times10^{17}/cm^3$. The base region 142 may be formed to have a thickness of about 0.3 μm to about 1 μm.

The source region 144 may be formed to include impurities of the first conductivity type. In some embodiments, the source region 144 may be formed to be doped with impurities of the first conductivity type at a high concentration. For example, the source region 144 may be doped with impurities of the first conductivity type at a concentration of about $5\times10^{18}/cm^3$ to about $5\times10^{19}/cm^3$. The source region 144 may be formed to have a thickness that is less than that of the base region 142. For example, the source region 144 may be formed to have a thickness of about 0.1 μm to about 0.5 μm.

In some embodiments, the base region 142 and the source region 144 may be formed by doping an upper part of the upper drift layer 124 shown in FIG. 2C with impurities of the second conductivity type and impurities of the first conductivity type, respectively. In some other embodiments, the base region 142 may be an epitaxial layer epitaxially grown using the upper drift layer 124 as a seed, and the source region 144 may be an epitaxial layer epitaxially grown using the upper drift layer 124 as a seed.

Figure 2E:
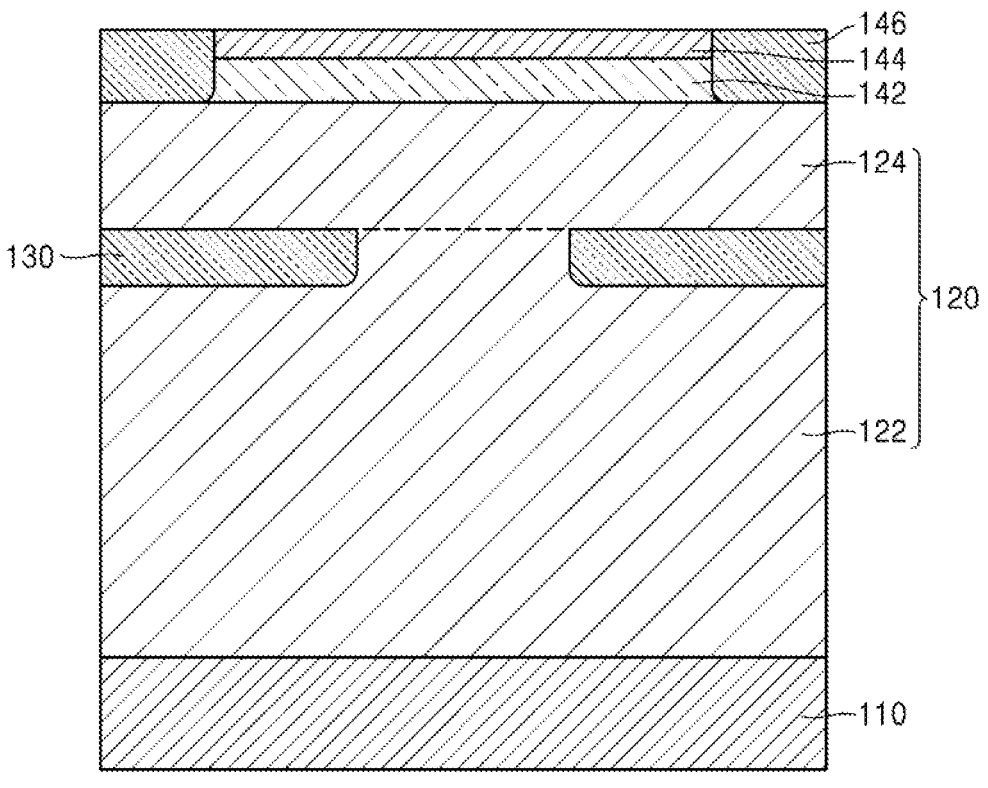

Referring to FIG. 2E, a pair of ohmic regions 146 are formed in a part of the source region 144 and a part of the base region 142. The pair of ohmic regions 146 may be formed to be apart from each other in a horizontal direction. The pair of ohmic regions 146 may extend from the upper surface of the source region 144 to the upper drift layer 124 to be in contact with the upper drift layer 124. The ohmic region 146 may be formed such that a thickness, i.e., a vertical height, is equal to or greater than the sum of a thickness of the base region 142 and a thickness of the source region 144.

The pair of ohmic regions 146 may include impurities of the second conductivity type. The pair of ohmic regions 146 may be formed by doping a part of the source region 144 and a part of the base region 142 with impurities of the second conductivity type. In some embodiments, the pair of ohmic regions 146 may be doped with impurities of the second conductivity type at a higher concentration than that of each of the shielding region 130 and the base region 142. For example, the ohmic region 146 may be doped with impurities of the second conductivity type at a concentration of about $5\times10^{18}/cm^3$ to about $5\times10^{19}/cm^3$.

Figure 2F:
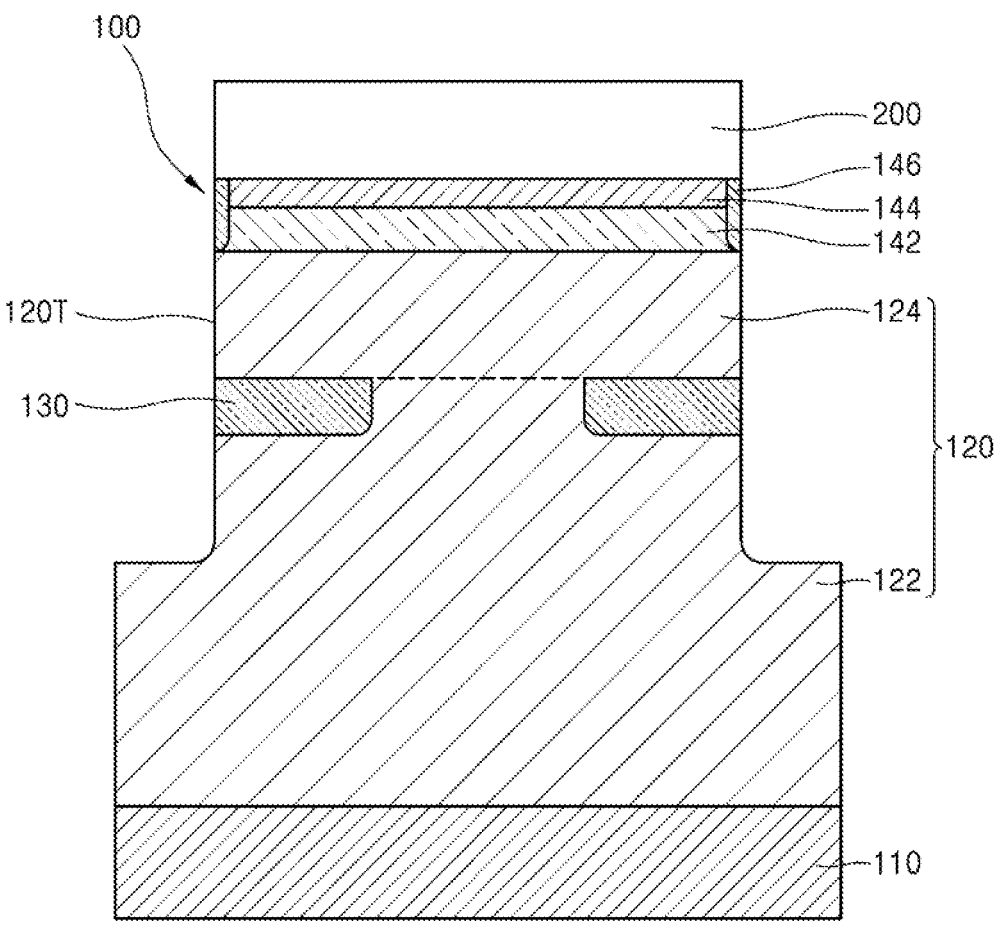

Referring to FIG. 2F, a mask layer 200 is formed on an upper surface of the body portion 100. The mask layer 200 may include photoresist, oxide, nitride, or a combination thereof. For example, the mask layer 200 may include silicon oxide. The mask layer 200 may be formed to cover the entire upper surface of the source region 144 and also cover an upper surface of a part of the ohmic region 146 adjacent to the source region 144.

Using the mask layer 200 as an etch mask, a pair of source trenches 120T defining the body portion 100 is formed by removing parts of the ohmic region 146, the upper drift layer 124, the shielding region 130, and the lower drift layer 122. The pair of source trenches 120T may be formed to extend from the upper surface of the source region 144 toward the base semiconductor layer 110 but not extend to the upper surface of the base semiconductor layer 110. For example, the source trench 120T may be formed to have a depth of about 6 μm to about 12 μm. In some embodiments, a vertical level of the bottom surface of the source trench 120T may be lower than a vertical level of the upper surface of the lower drift layer 122.

The body portion 100 includes the drift layer 120 including the lower drift layer 122 and the upper drift layer 124, the pair of shielding regions 130, the base region 142, the source region 144, and the pair of ohmic regions 146. The pair of ohmic regions 146 included in the body portion 100 may be parts of the pair of ohmic regions 146 shown in FIG. 2E overlapping the mask layer 200 in the vertical direction.

Figure 2G:
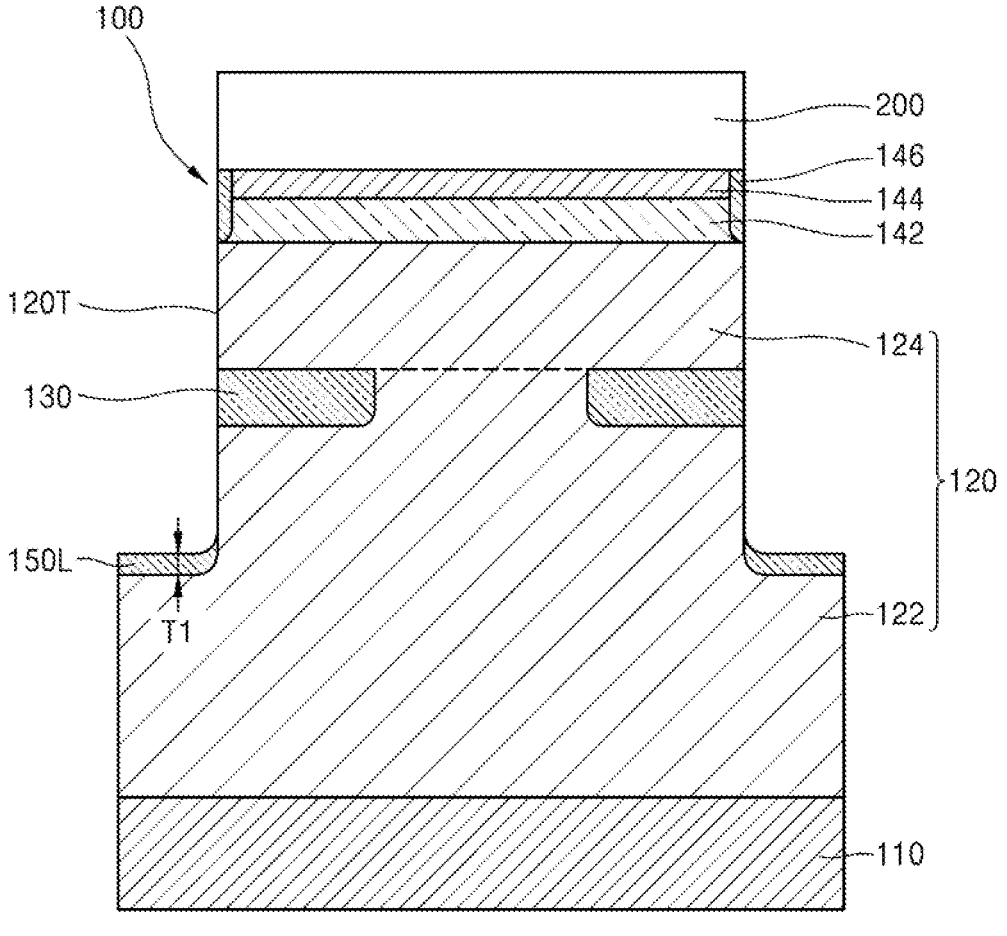

Referring to FIG. 2G, the bottom pillar region 150L is formed in a part of the lower drift layer 122 exposed on the bottom surface of the source trench 120T. The bottom pillar region 150L may include impurities of the second conductivity type. The bottom pillar region 150L may be formed by doping the part of the lower drift layer 122 exposed on the bottom of the source trench 120T with impurities of the second conductivity type. In some embodiments, the bottom pillar region 150L may be formed to be doped with impurities of the second conductivity type at a lower concentration than that of the shielding region 130 and the ohmic region 146. For example, the bottom pillar region 150L may be doped with impurities of the second conductivity type at a concentration of about $1\times10^{16}/cm^3$ to about $5\times10^{17}/cm^3$. The bottom pillar region 150L may be formed such that first thickness T1, which is a thickness in the vertical direction, has a value of about 0.3 μm to about 0.5 μm.

Figure 2H:
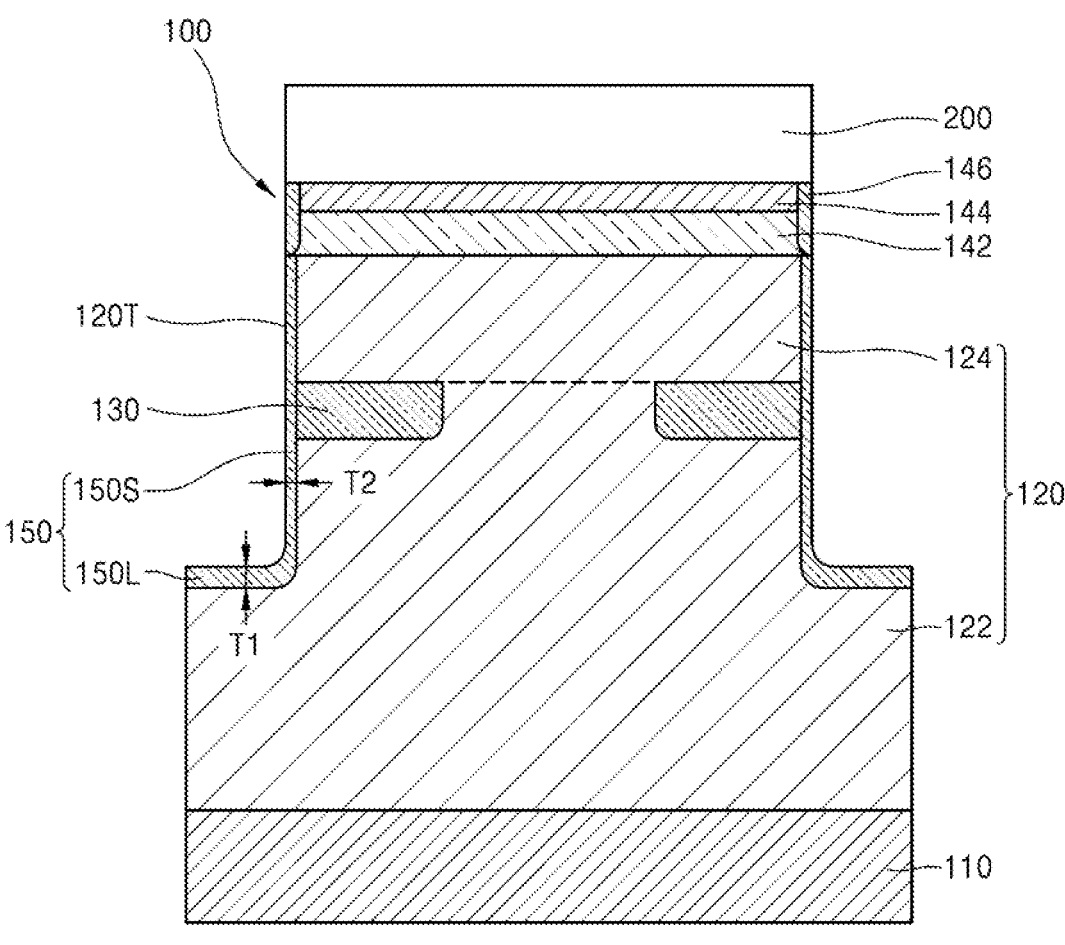

Referring to FIG. 2H, the side pillar region 150S is formed in the lower drift layer 122 exposed on the inner side surface of the source trench 120T, the shielding region 130, and the upper drift layer 124 so that the pillar region 150 including the bottom pillar region 150L and the side pillar region 150S is formed.

The side pillar region 150S may include impurities of the second conductivity type. The side pillar region 150S may be formed by doping parts of the lower drift layer 122 exposed on the inner side surface of the source trench 120T, the shielding region 130, and the upper drift layer 124 with impurities of the second conductivity type. In some embodiments, the side pillar region 150S may be formed by tilted ion implantation.

In some embodiments, the side pillar region 150S may be formed to be doped with impurities of the second conductivity type at a lower concentration than that of the shielding region 130 and the ohmic region 146. The side pillar region 150S may be doped with impurities of the second conductivity type at substantially the same concentration as that of the bottom pillar region 150L. For example, the side pillar region 150S may be doped with impurities of the second conductivity type at a concentration of about $1\times10^{16}/cm^3$ to about $5\times10^{17}/cm^3$. The side pillar region 150S may be formed such that the second thickness T2, which is a thickness in the horizontal direction, has a value of about 0.5 μm to about 0.8 μm. The second thickness T2 may have a value less than the first thickness T1.

In a process of forming the side pillar region 150S, the ohmic region 146 may be further doped with impurities of the second conductivity type. However, the concentration of impurities of the second conductivity type doped into the ohmic region 146 is at least one order or more, that is, 10 times or more, higher than the concentration of impurities of the second conductivity type doped into the side pillar region 150S, and thus, an amount of impurities of the second conductivity type doped into the ohmic region 146 may be ignored in the process of forming the side pillar region 150S.

Figure 2I:
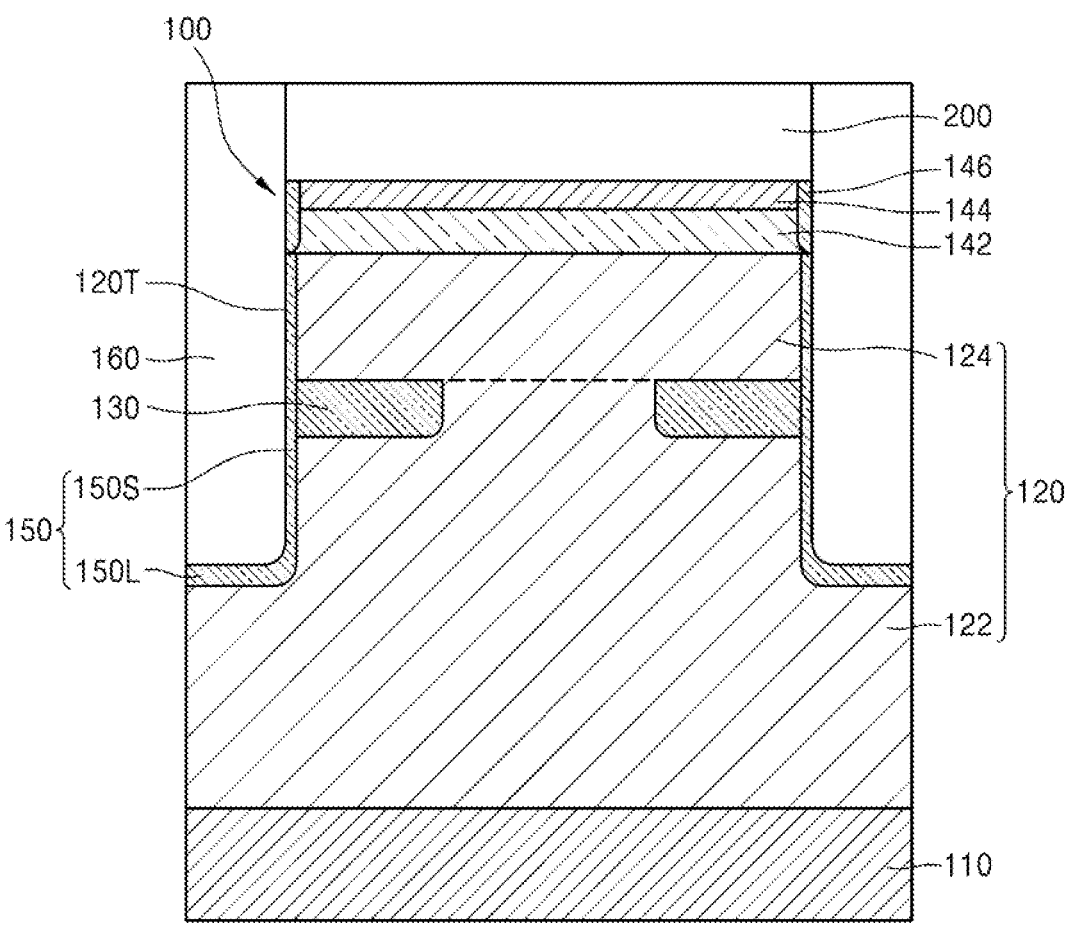

Referring to FIG. 2I, the filling insulating layer 160 covering the pillar region 150 and filled in the source trench 120T is formed. The filling insulating layer 160 may include oxide, nitride, oxynitride, or a combination thereof. In some embodiments, the filling insulating layer 160 may be formed to include silicon oxide.

Figure 2J:
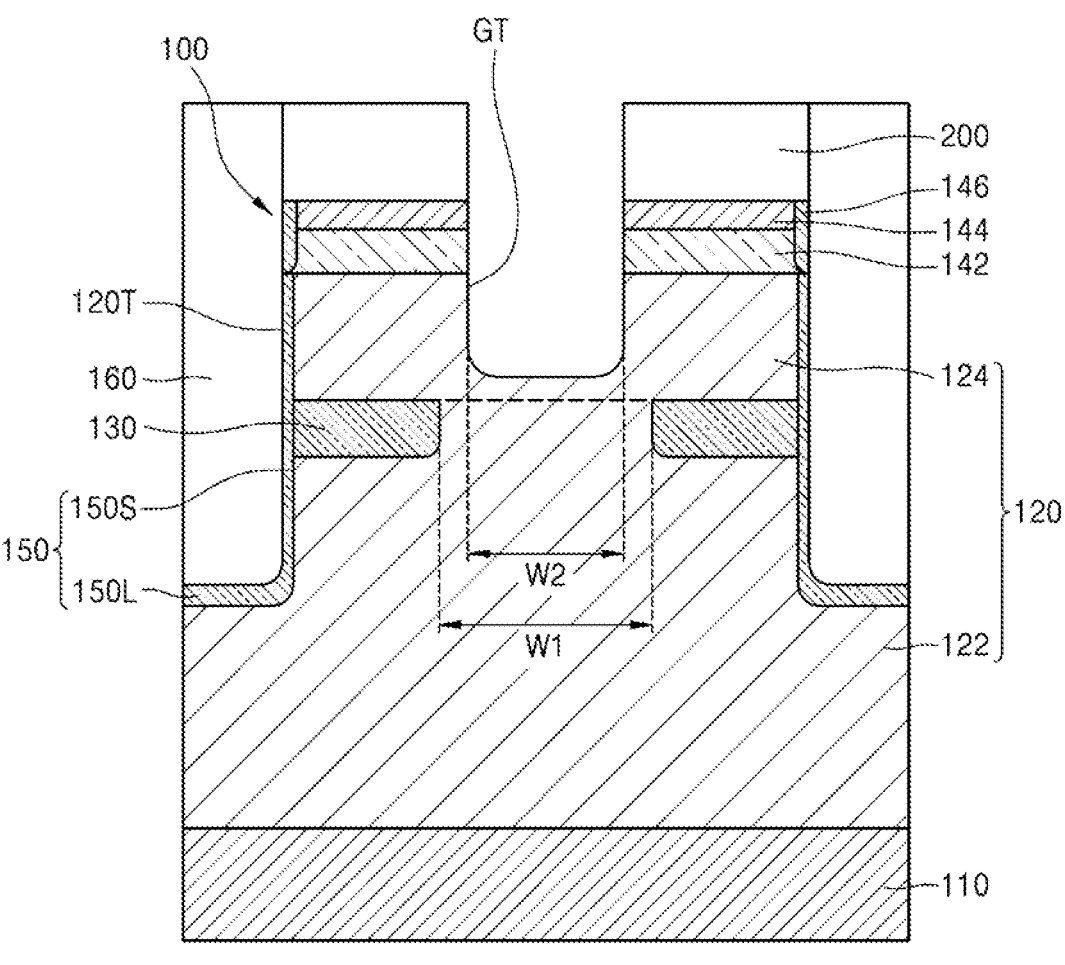

Referring to FIG. 2J, a part of the mask layer 200 is removed so that a part of the source region 144 is exposed, and then, the gate trench GT extending in the upper drift layer 124 is formed through the source region 144 and the base region 142 using the remaining mask layer 200 as an etch mask.

The gate trench GT may be formed to extend into the upper drift layer 124 but not to extend to the upper surface of the lower drift layer 122. The gate trench GT may be formed such that a bottom surface thereof is located at a vertical level higher than the upper surface of the pair of shielding regions 130. The gate trench GT may be formed to have a depth greater than the sum of the thickness of the base region 142 and the thickness of the source region 144, and less than the sum of the thickness of the base region 142, the thickness of the source region 144, and the thickness of the upper drift layer 124. For example, the gate trench GT may be formed to have a depth of about 1.2 μm to about 1.8 μm. The gate trench GT may be formed to have the second width W2. In some embodiments, the second width W2 may have a value less than that of the first width W1. For example, the second width W2 may be about 1 μm to about 2.5 μm. The gate trench GT may be formed so as not to overlap the pair of shielding regions 130 in the vertical direction.

Figure 2K:
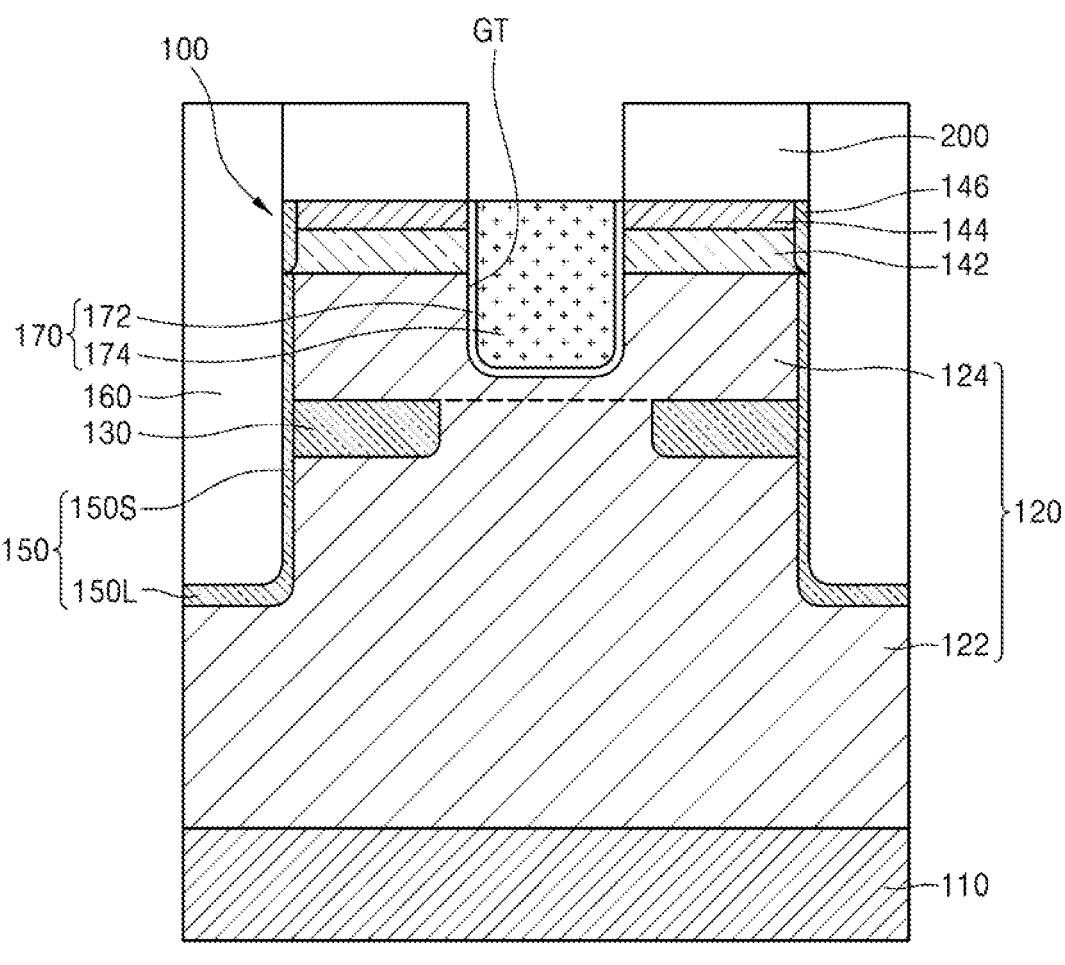

Referring to FIG. 2K, the gate structure 170 filled in the gate trench GT is formed. The gate structure 170 may include the gate insulating layer 172 and the gate electrode 174.

The gate insulating layer 172 may be formed to conformally cover a bottom surface and inner side surfaces of the gate trench GT. For example, the gate insulating layer 172 may be formed to conformally cover the surfaces of the base region 142, the source region 144, and the upper drift layer 124 in the gate trench GT.

The gate insulating layer 172 may be formed to include at least one selected from silicon oxide, silicon nitride, silicon oxynitride, oxide/nitride/oxide (ONO), or a high-k dielectric material having a dielectric constant higher than that of silicon oxide. The gate insulating layer 172 may be formed to have a thickness of several tens nm. For example, the gate insulating layer 172 may be formed to have a thickness of about 20 nm to about 70 nm.

The gate electrode 174 may be formed to cover the gate insulating layer 172 and to be filled in the gate trench GT. For example, the gate electrode 174 may be formed to include doped polysilicon, a metal material, such as W, Ti, or Ta, a conductive metal nitride, such as TiN, Ta, TaN, WN, TiSiN, WSiN, or a combination thereof.

Figure 2L:
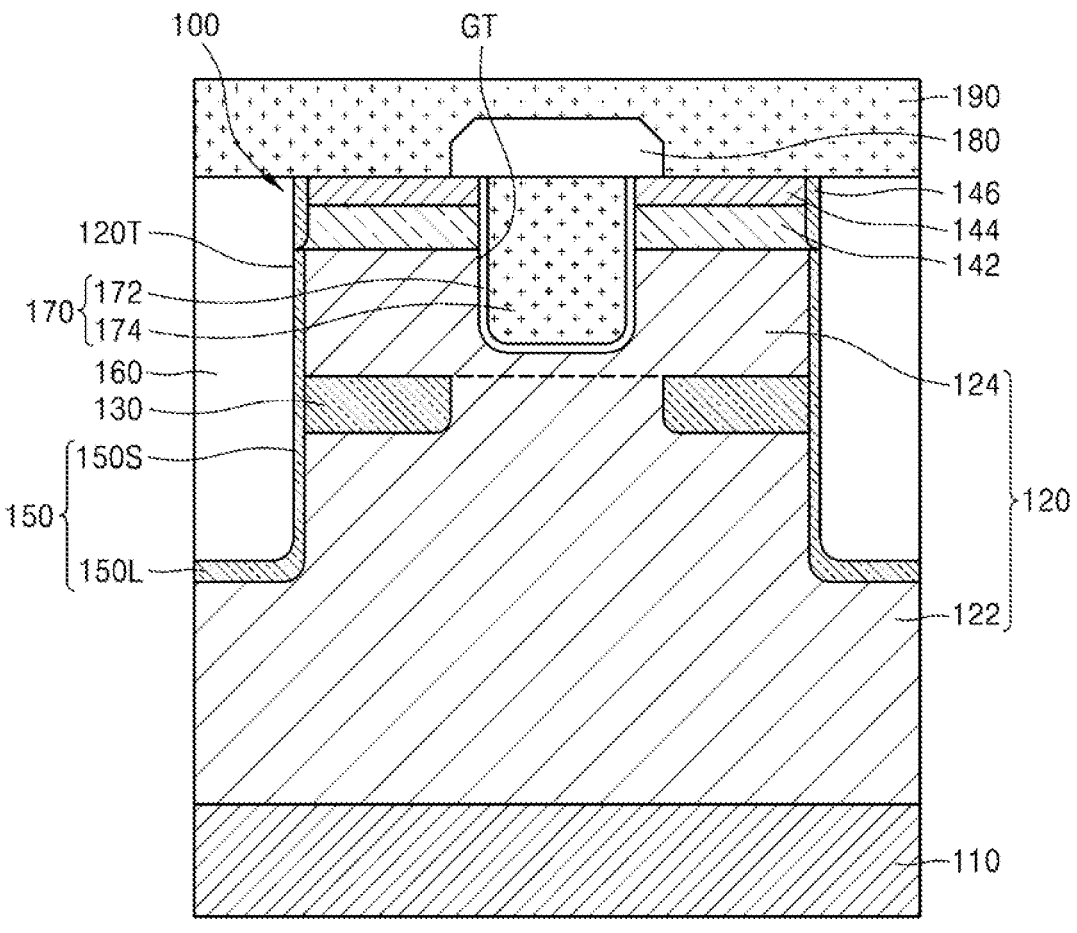

Referring to FIGS. 2K and 2L together, the mask layer 200 is removed. In some embodiments, in a process of removing the mask layer 200, a part of the filling insulating layer 160 that is at the same vertical level as the mask layer 200, that is, a part of the filling insulating layer 160 that is at a higher vertical level than the upper surface of the source region 144, may also be removed.

After the mask layer 200 is removed, the capping insulating layer 180 covering the gate electrode 174 is formed, the source electrode 190 covering the source region 144 is formed, and the formation of the pair of ohmic regions 146 is completed. For example, the source electrode 190 may be formed to cover the source region 144, the pair of ohmic regions 146, the filling insulating layer 160, and the capping insulating layer 180. The source electrode 190 may be apart from the gate electrode 174 by the capping insulating layer 180.

Thereafter, as shown in FIG. 1, the power semiconductor device 1 may be formed by forming the drain electrode 195 on the lower surface of the base semiconductor layer 110. The drain electrode 195 may be formed to completely cover the lower surface of the base semiconductor layer 110. For example, the drain electrode 195 may be formed to include doped polysilicon, a metal material, a metal nitride, a metal silicide, or a combination thereof.

In some embodiments, when the base semiconductor layer 110 is a part of a semiconductor wafer, the base semiconductor layer 110 may be formed by removing a lower part of the semiconductor wafer, and the drain electrode 195 may be formed on the lower surface of the base semiconductor layer 110.

In another embodiment, when the base semiconductor layer 110 is an epitaxial layer formed on a support substrate, the drain electrode 195 may be formed on the lower surface of the base semiconductor layer 110 after the support substrate is removed.

Figure 3:
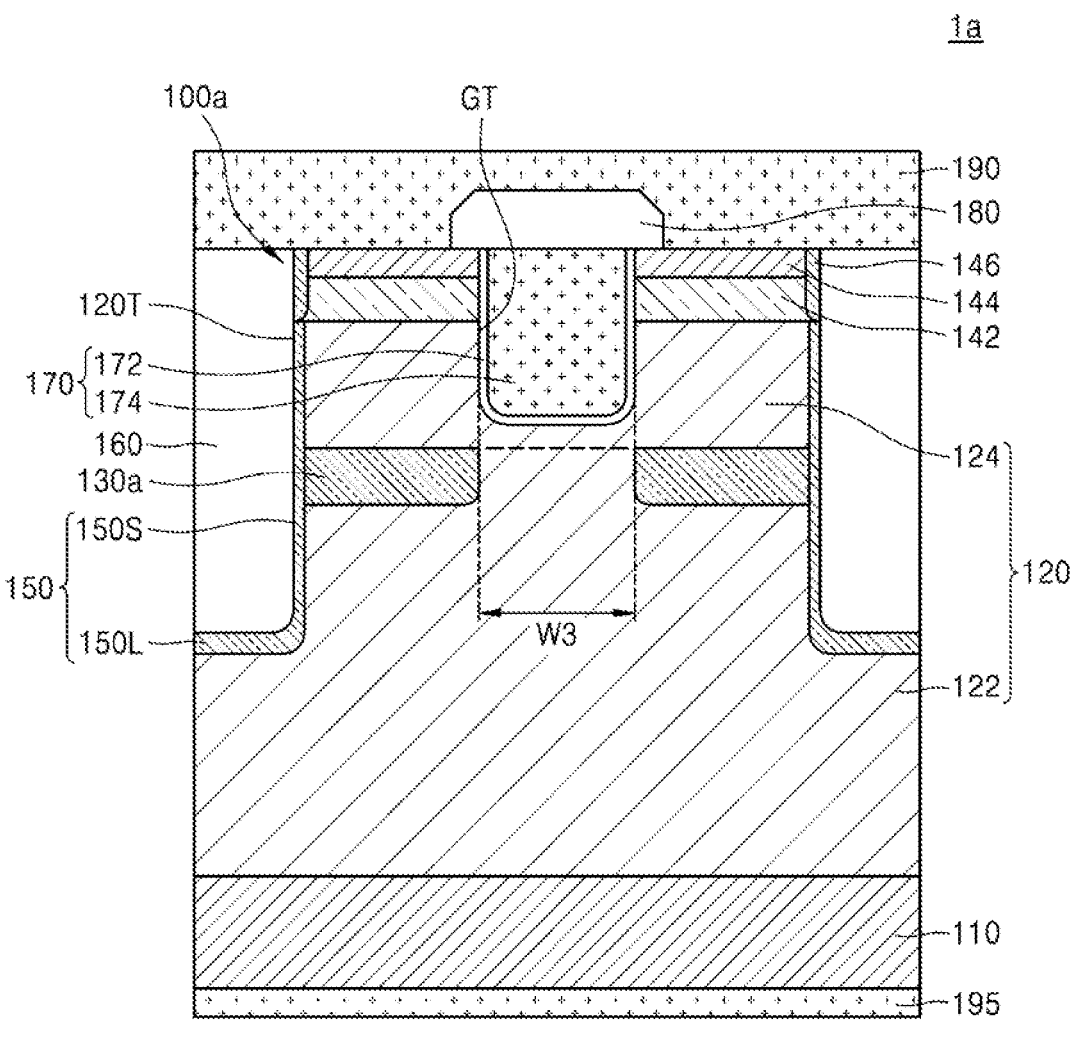
FIG. 3 is a cross-sectional view illustrating a power semiconductor device according to an embodiment.

FIG. 3 is a cross-sectional view illustrating a power semiconductor device 1a according to embodiments. In FIG. 3, the same reference numerals as those of FIG. 1 indicate substantially the same members, and redundant descriptions with those with reference to FIG. 1 may be omitted.

Referring to FIG. 3, the power semiconductor device 1a includes the base semiconductor layer 110, a body portion 100a, and the gate structure 170. In some embodiments, the body portion 100a may include the drift layer 120, the pair of shielding regions 130a, the base region 142, the source region 144, the pair of ohmic regions 146, and the pillar region 150.

The pair of source trenches 120T may extend from an upper surface of the source region 144 toward the base semiconductor layer 110 to define the body portion 100.

The shielding region 130a may be between the lower drift layer 122 and the upper drift layer 124. The shielding region 130a may include impurities of a second conductivity type. For example, the second conductivity type may be a p-type. In some embodiments, the shielding region 130a may be doped with impurities of the second conductivity type at a high concentration. For example, the shielding region 130a may be doped with impurities of the second conductivity type at a concentration of about $1 \times 10^{18}/\text{cm}^3$ to about $5 \times 10^{18}/\text{cm}^3$. The shielding region 130a may have a thickness of about 0.5 μm to about 2 μm.

In some embodiments, the body portion 100a may include a pair of shielding regions 130a apart from each other in a horizontal direction. The pair of shielding regions 130a may be disposed in both ends between the lower drift layer 122 and the upper drift layer 124 in the horizontal direction between the lower drift layer 122 and the upper drift layer 124. The pair of shielding regions 130a may be apart from each other by a third width W3. In some embodiments, the third width W3 may be about 1 μm to about 2.5 μm.

In some embodiments, the pair of shielding regions 130a may be formed by doping a part of an upper side of the lower drift layer 122 with impurities of the second conductivity type. For example, an upper surface of each of the pair of shielding regions 130a and the uppermost surface of the lower drift layer 122 may be located at the same vertical level to be coplanar.

The body portion 100a may include the gate trench GT extending from the uppermost surface of the body portion 100a, that is, the upper surface of the source region 144, into the drift layer 120 through the base region 142 and the source region 144. A width of the gate trench GT may be substantially equal to the third width W3. The gate trench GT may not overlap the pair of shielding regions 130a in the vertical direction.

Figure 4:
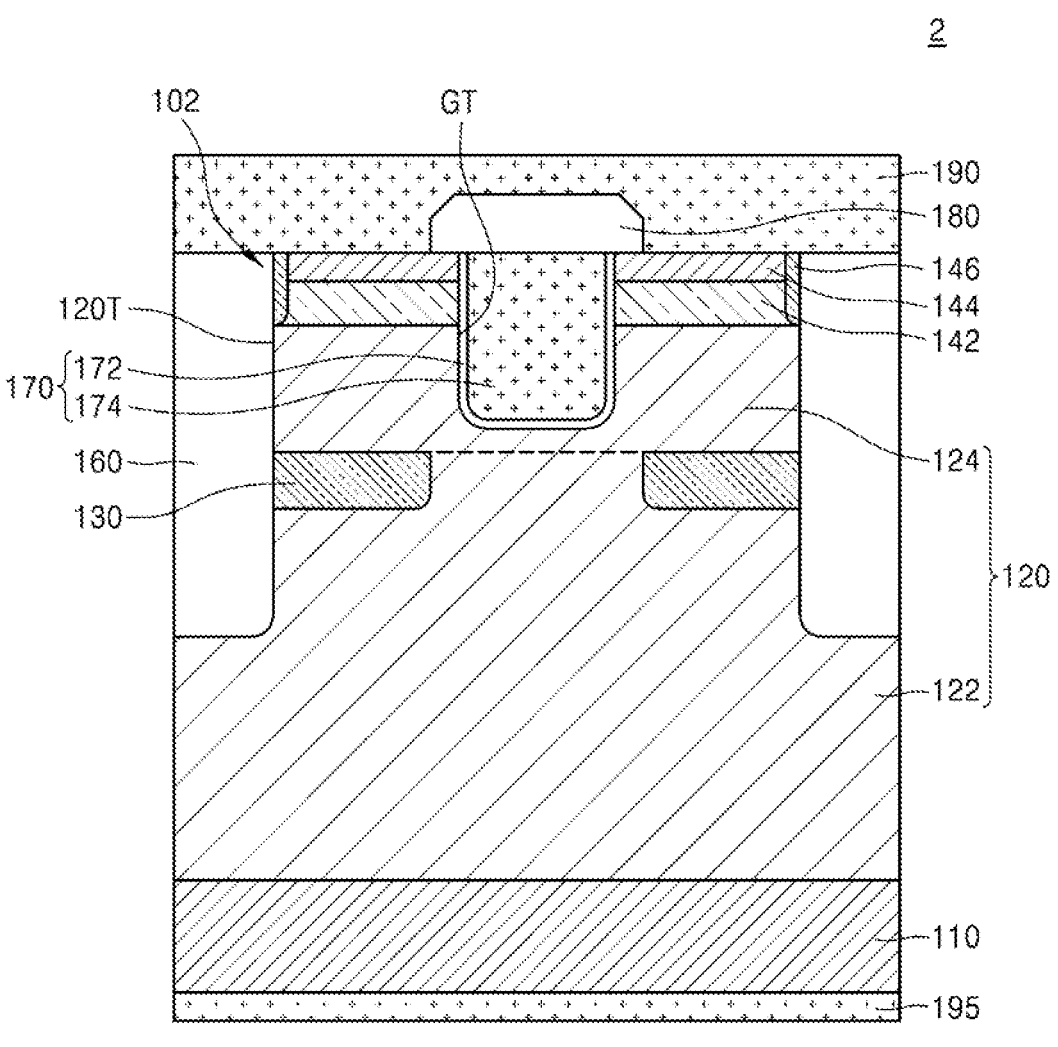
FIG. 4 is a cross-sectional view illustrating a power semiconductor device according to an embodiment.

FIG. 4 is a cross-sectional view illustrating a power semiconductor device 2 according to embodiments of the disclosure. In FIG. 4, the same reference numerals as those of FIG. 1 indicate substantially the same members, and redundant descriptions with those with reference to FIG. 1 may be omitted.

Referring to FIG. 4, the power semiconductor device 2 includes the base semiconductor layer 110, a body portion 102, and the gate structure 170. In some embodiments, the body portion 102 may include the drift layer 120, the pair of shielding regions 130, the base region 142, the source region 144, and the pair of ohmic regions 146.

Unlike the power semiconductor device 1 shown in FIG. 1, the power semiconductor device 2 shown in FIG. 4 may not include the pillar region 150. The power semiconductor device 2 may include a shielding region contact plug electrically connected to the shielding region 130. For example, the shielding region contact plug may be disposed at the front or rear side with respect to the cross-sectional view shown in FIG. 4, and may be in contact with an upper surface of the shielding region 130 and extend upward.

Figure 5:
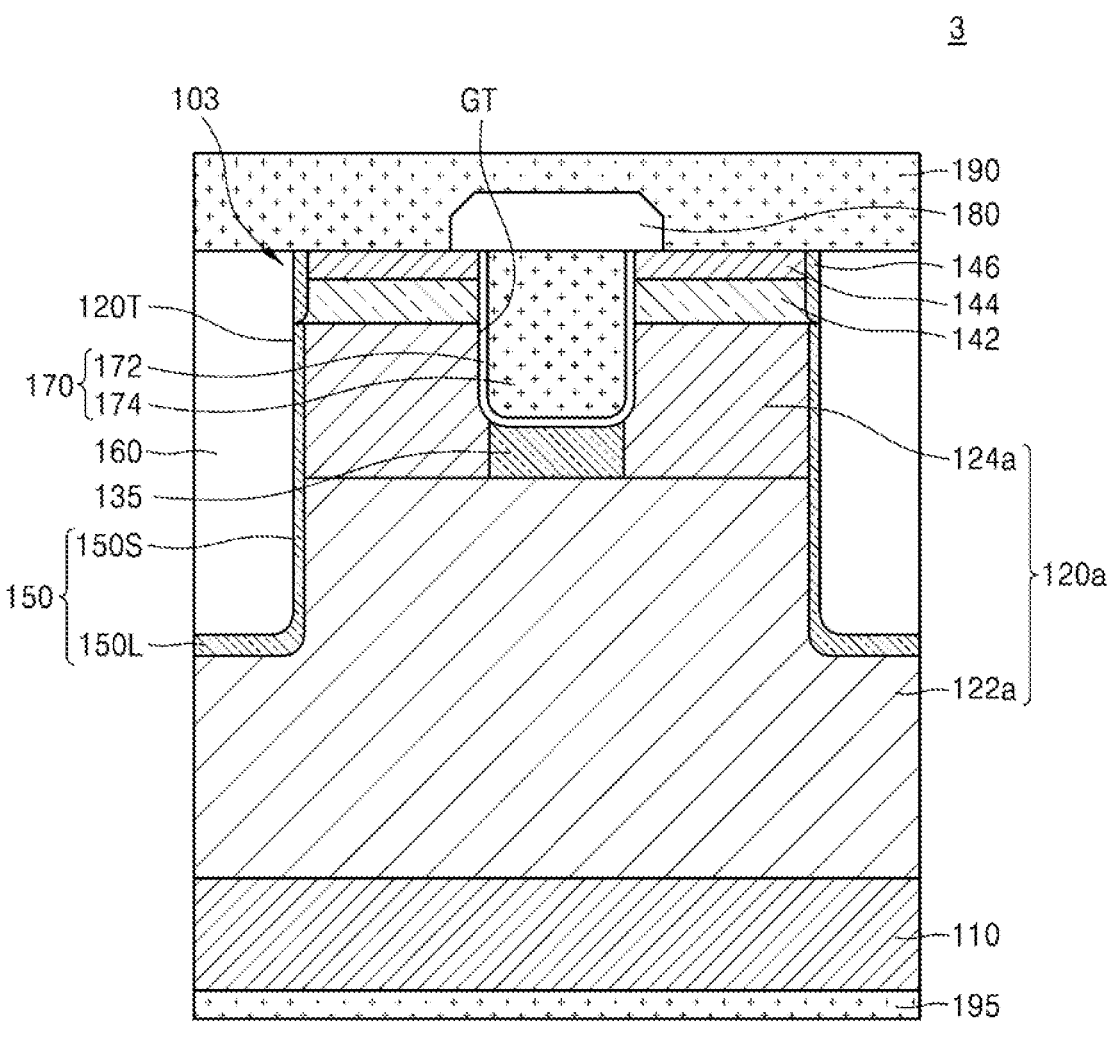
FIG. 5 is a cross-sectional view illustrating a power semiconductor device according to an embodiment.

FIG. 5 is a cross-sectional view illustrating a power semiconductor device 3 according to embodiments of the disclosure. In FIG. 5, the same reference numerals as those of FIG. 1 indicate substantially the same members, and redundant descriptions with those with reference to FIG. 1 may be omitted.

Referring to FIG. 5, the power semiconductor device 3 includes the base semiconductor layer 110, a body 103, and the gate structure 170. In some embodiments, the body portion 103 may include a drift layer 120a, a shielding region 135, the base region 142, the source region 144, the pair of ohmic regions 146, and the pillar region 150. The power semiconductor device 3 shown in FIG. 5 may include the drift layer 120a and one shielding region 135, instead of the drift layer 120 and a pair of shielding regions 130 of the power semiconductor device 1 shown in FIG. 1.

The drift layer 120a may be disposed on the semiconductor layer 110. The drift layer 120a may include a semiconductor material or a compound semiconductor material. For example, the drift layer 120a may be an epitaxial layer formed on the base semiconductor layer 110.

In some embodiments, the drift layer 120a may include SiC. In some embodiments, the drift layer 120a may include 4H—SiC.

The drift layer 120a may include impurities of a first conductivity type. In some embodiments, the drift layer 120a may be doped with impurities of the first conductivity type at a lower concentration than that of the base semiconductor layer 110. The drift layer 120a may have a thickness of about 10 μm to about 20 μm. In some embodiments, the sum of the thicknesses of the base semiconductor layer 110 and the drift layer 120a may be about 11 μm to about 25 μm.

The drift layer 120a may have a stacked structure of a lower drift layer 122a and an upper drift layer 124a. For example, the lower drift layer 122a may be disposed on the base semiconductor layer 110, and the upper drift layer 124a may be disposed on the lower drift layer 122a. The lower drift layer 122a may be between the base semiconductor layer 110 and the upper drift layer 124a. The lower drift layer 122a may be an epitaxial layer formed on the base semiconductor layer 110. The upper drift layer 124a may be an epitaxial layer formed on the lower drift layer 122a.

The drift layer 120a may include a lower side part and an upper side part having a horizontal width narrower than that of the lower side part. The upper side part of the drift layer 120a may be located at the same vertical level as a pair of source trenches 120T extending from the uppermost surface of the drift layer 120a toward the base semiconductor layer 110, and the lower side part of the drift layer 120a may be located at a vertical level lower than bottom surfaces of the pair of source trenches 120T. The pair of source trenches 120T may have the upper side part of the drift layer 120a therebetween, and may be apart from each other in a horizontal direction.

Each of the lower drift layer 122a and the upper drift layer 124a may include impurities of a first conductivity type. The upper drift layer 124a may be doped with impurities of the first conductivity type at a slightly higher concentration than that of the lower drift layer 122a. For example, the lower drift layer 122a may be doped with impurities of the first conductivity type at a concentration of about $5 \times 10^{11}/\text{cm}^3$ to about $5 \times 10^6/\text{cm}^3$, and the upper drift layer 124a may be doped with impurities of the first conductivity type at a concentration of about $1 \times 10^{16}/\text{cm}^3$ to about $1 \times 10^{17}/\text{cm}^3$. In some embodiments, a thickness of the lower drift layer 122a may be greater than a thickness of the upper drift layer 124a. For example, the thickness 122a of the lower drift layer may be about 8 μm to about 15 μm, and the thickness of the upper drift layer 124a may be about 2 μm to about 6 μm.

The shielding region 135 may be disposed between the lower drift layer 122a and the upper drift layer 124a. In some embodiments, the shielding region 135 may be formed by doping a lower side part of the upper drift layer 122a with impurities of the second conductivity type. The shielding region 135 may include SiC. In some embodiments, the shielding region 135 may include 4H—SiC. For example, the lower surface of the shielding region 135 and the lower surface of the upper drift layer 124a may be located at the same vertical level to be coplanar.

The base region 142 and the source region 144 may be sequentially disposed on the upper drift layer 124a. A pair of ohmic regions 146 may be disposed in both ends of the base region 142 and the source region 144 in the horizontal direction. The vertical level of the lower surface of the pair of ohmic regions 146 may be equal to or lower than the vertical level of the upper surface of the upper drift layer 124a.

The body portion 103 may include the gate trench GT extending from the uppermost surface of the body portion 100, i.e., the upper surface of the source region 144, into the drift layer 120a through the base region 142 and the source region 144. The gate trench GT may extend into the upper drift layer 124a, but may not extend to the upper surface of the lower drift layer 122a. The gate trench GT may extend to the shielding region 135. The gate trench GT may overlap the shielding region 135 in the vertical direction. The shielding region 135 may be exposed on a bottom surface of the gate trench GT. That is, the bottom surface of the gate trench GT and the upper surface of the shielding region 135 may be located at the same vertical level.

The gate structure 170 may be filled in the gate trench GT. The gate structure 170 may include the gate insulating layer 172 and the gate electrode 174. The gate insulating layer 172 may conformally cover the bottom and inner side surfaces of the gate trench GT. For example, the gate insulating layer 172 may conformally cover the surfaces of the base region 142, the source region 144, the upper drift layer 124a, and the shielding region 135 in the gate trench GT.

While embodiment of the disclosure have been particularly shown and described, it will be understood that various changes in form and details may be made therein without departing from the spirit and scope of the following claims.

What is claimed is:

1. A power semiconductor device comprising:
a base semiconductor layer comprising impurities of a first conductivity type;
a body portion provided on the base semiconductor layer and defined by a source trench, the body portion comprising a gate trench extending inwardly from an upper surface of the body portion;
a gate electrode provided in the gate trench;
a source electrode provided on the body portion and spaced apart from the gate electrode; and
a drain electrode provided below the base semiconductor layer,
wherein the body portion comprises:
a drift layer provided on the base semiconductor layer and comprising impurities of the first conductivity type; and
a pair of shielding regions provided in the drift layer, spaced apart from each other in a horizontal direction, and spaced apart from the base semiconductor layer and the gate trench, the pair of shielding regions comprising impurities of a second conductivity type different from the first conductivity type,
wherein the drift layer comprises:
a lower drift layer provided on the base semiconductor layer; and
an upper drift layer provided on the lower drift layer,
wherein the pair of shielding regions is between the lower drift layer and the upper drift layer such that the pair of shielding regions overlaps with the lower drift layer in a vertical direction and the upper drift layer overlaps with the pair of shielding regions in the vertical direction, and
wherein a horizontal width of the gate trench is equal to or less than a separation distance between the pair of shielding regions.

2. The power semiconductor device of claim 1, wherein an uppermost surface of the lower drift layer and an upper surface of the pair of shielding regions are located at a same vertical level to be coplanar.

3. The power semiconductor device of claim 1, wherein a thickness of the lower drift layer is greater than a thickness of the upper drift layer.

4. The power semiconductor device of claim 1, wherein the source trench extends from the upper surface of the body portion into the lower drift layer to be lower than the pair of shielding regions.

5. The power semiconductor device of claim 1, wherein the body portion further comprises a pillar region covering the drift layer and the pair of shielding regions along a bottom surface and inner side surfaces of the source trench, the pillar region comprising impurities of the second conductivity type.

6. The power semiconductor device of claim 5, wherein the body portion further comprises:
a base region provided on the drift layer and doped with impurities of the second conductivity type at a concentration lower than a concentration of the impurities of the second conductivity type of the pair of shielding regions;

a source region disposed on the base region, connected to the source electrode, and doped with impurities of the first conductivity type at a concentration higher than a concentration of the impurities of the first conductivity type of the drift layer; and
a pair of ohmic regions provided at ends of the base region and the source region to be in contact with the pillar region, the pair of ohmic regions being doped with impurities of the second conductivity type at a higher concentration than a concentration of the impurities of the second conductivity type of the base region.

7. The power semiconductor device of claim 5, wherein the pillar region comprises:
a bottom pillar region covering the drift layer and extending in the horizontal direction along the bottom surface of the source trench; and
a side pillar region covering the drift layer and the pair of shielding regions and extending in the vertical direction along the inner side surfaces of the source trench, and
wherein a thickness of the bottom pillar region in the vertical direction is greater than a thickness of the side pillar region in the horizontal direction.

8. The power semiconductor device of claim 1, wherein the body portion comprises 4H—SiC.

9. The power semiconductor device of claim 1, wherein the gate trench and the source trench are non-overlapping in the vertical direction with respect to the pair of shielding regions.

10. A power semiconductor device comprising:
a base semiconductor layer comprising impurities of a first conductivity type;
a body portion provided on the base semiconductor layer and defined by a source trench, the body portion comprising a gate trench extending inwardly from an upper surface of the body portion;
a gate electrode provided in the gate trench;
a source electrode provided on the body portion and spaced apart from the gate electrode; and
a drain electrode provided below the base semiconductor layer,
wherein the body portion comprises:
a drift layer comprising impurities of the first conductivity type, a lower drift layer provided on the base semiconductor layer, and an upper drift layer provided on the lower drift layer;
a pillar region covering the drift layer along a bottom surface and inner side surfaces of the source trench, the pillar region comprising impurities of a second conductivity type different from the first conductivity type; and
at least one shielding region provided between the lower drift layer and the upper drift layer, the at least one shielding region comprising impurities of the second conductivity type.

11. The power semiconductor device of claim 10, wherein the at least one shielding region comprises a pair of shielding regions spaced apart from each other in a horizontal direction and spaced apart from the base semiconductor layer and the gate trench.

12. The power semiconductor device of claim 10, wherein a side region of the pillar region forms a superjunction with the drift layer.

13. The power semiconductor device of claim 10, wherein a thickness of the lower drift layer is greater than a thickness of the upper drift layer, and wherein the source trench extends from the upper surface of the body portion to a lower vertical level than a lower surface of the at least one shielding region.

14. The power semiconductor device of claim 10, wherein the body portion further comprises:

a base region provided on the drift layer and doped with impurities of the second conductivity type at a concentration lower than a concentration of the impurities of the second conductivity type of the at least one shielding region;

a source region provided on the base region, connected to the source electrode, and doped with impurities of the first conductivity type at a concentration higher than a concentration of the impurities of the first conductivity type of the drift layer; and a pair of ohmic regions provided at ends of the base region and the source region to be in contact with an upper end of the pillar region, the pair of ohmic regions being doped with impurities of the second conductivity type at a concentration higher than a concentration of the impurities of the second conductivity type of the base region.

15. The power semiconductor device of claim 10, wherein the gate trench overlaps the at least one shielding region in a vertical direction and extends to the at least one shielding region.

16. The power semiconductor device of claim 15, wherein the upper drift layer is doped with impurities of the first conductivity type at a concentration higher than a concentration of the impurities of the first conductivity type of the lower drift layer.

17. A power semiconductor device comprising:

a base semiconductor layer comprising impurities of a first conductivity type;

a body portion provided on the base semiconductor layer and defined by a source trench, the body portion comprising 4H-SiC and a gate trench extending inwardly from an upper surface of the body portion;

a gate electrode provided in the gate trench;

a source electrode spaced apart from the gate electrode and provided on the body portion; and a drain electrode provided below the base semiconductor layer, wherein the body portion comprises:

a drift layer comprising impurities of the first conductivity type, a lower drift layer provided on the base semiconductor layer, and an upper drift layer provided on the lower drift layer;

a pair of shielding regions provided between the lower drift layer and the upper drift layer, spaced apart from each other in a horizontal direction, and spaced apart from the base semiconductor layer and the gate trench, the pair of shielding regions comprising impurities of a second conductivity type different from the first conductivity type;

a pillar region covering the lower drift layer, the pair of shielding regions, and the upper drift layer along a bottom surface and inner side surfaces of the source trench, the pillar region comprising impurities of the second conductivity type;

a base region provided on the drift layer and doped with impurities of the second conductivity type at a concentration lower than a concentration of the impurities of the second conductivity type of the pair of shielding regions;

a source region provided on the base region, connected to the source electrode, and doped with impurities of the first conductivity type at a concentration higher than a concentration of the impurities of the first conductivity type of the drift layer; and a pair of ohmic regions disposed at ends of the base region and the source region to be in contact with an upper end of the pillar region, the pair of ohmic regions being doped with impurities of the second conductivity type at a concentration higher than the concentration of the impurities of the second conductivity type of the base region.

18. The power semiconductor device of claim 17, wherein a thickness of the lower drift layer is greater than a thickness of the upper drift layer;

wherein an uppermost surface of the lower drift layer and an upper surface of the pair of shielding regions are at a same vertical level, and wherein the source trench extends from the upper surface of the body portion to a vertical level lower than a lower surface of the pair of shielding regions.

19. The power semiconductor device of claim 17, wherein the pillar region comprises:

a bottom pillar region covering the drift layer and extending in the horizontal direction along the bottom surface of the source trench; and a side pillar region covering the lower drift layer, the pair of shielding regions, and the drift layer and extending in a vertical direction along the inner side surfaces of the source trench, the side pillar region having a thickness of about 0.3 μm to about 0.8 μm, and the side pillar region extending along the bottom surface and the inner side surfaces of the source trench, and wherein a thickness of the bottom pillar region in the vertical direction is greater than the thickness of the side pillar region in the horizontal direction.

* * * * *